United States Patent [19]
Dangler et al.

[11] Patent Number: 6,024,580
[45] Date of Patent: *Feb. 15, 2000

[54] HIGH PERFORMANCE PAD ON PAD CONNECTOR FOR FLEX CIRCUIT PACKAGING

[75] Inventors: John Richard Dangler; Mark Kenneth Hoffmeyer, both of Rochester; Thomas Donald Kidd, Stewartville; Miles Frank Swain, Hayfield, all of Minn.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/004,235

[22] Filed: Jan. 8, 1998

[51] Int. Cl.[7] ....................................................... H01R 9/09
[52] U.S. Cl. ............................................. 439/67; 439/493
[58] Field of Search ....................................... 439/67, 493

[56] References Cited

U.S. PATENT DOCUMENTS

| | | | |
|---|---|---|---|
| 3,114,587 | 12/1963 | Herrmann | 439/493 |
| 4,116,517 | 9/1978 | Selvin et al. | 439/67 |
| 4,871,315 | 10/1989 | Noschese | 439/493 |
| 4,911,653 | 3/1990 | Walton et al. | 439/493 |
| 5,147,208 | 9/1992 | Bachler | 439/67 |
| 5,372,512 | 12/1994 | Wilson et al. | 439/67 |

*Primary Examiner*—Steven L. Stephan
*Assistant Examiner*—T C Patel
*Attorney, Agent, or Firm*—Robert W. Lahtinen; Matthew J. Bussan

[57] ABSTRACT

A flex cable pad on pad terminal structure is shown having raised connector pads formed using a rigid stiffener with raised features or bumps formed integral with the stiffener; aligned with the connector pad surfaces; and laminated to the flex cable surface opposite the surface presenting the exposed connector pad surfaces, to create raised contact pads that are not subject to relaxation over time when subjected to high contact normal forces. The use of a metal stiffener which has been coined to produce the raised features aligned with the contact pad locations and lamination using a film or layer of thermocuring adhesive affords an economical process and assembly technique that also effects hot deformation of the flex cable at the contact pad locations.

8 Claims, 8 Drawing Sheets

HIGH PERFORMANCE PAD ON PAD CONNECTOR FOR FLEX CIRCUIT PACKAGING

FIELD OF THE INVENTION

The present invention pertains to pad on pad electrical connectors and more particularly, to pad on pad connectors for flex cable applications.

BACKGROUND OF THE INVENTION

Increased demands placed on electrical performance of connectors in high speed applications, including optical transceiver and high data rate rigid disk drive storage products, require very short connection lengths to minimize interconnection inductances, contact resistances, and signal lengths. Use of short interconnects also enables greater control for impedance matching at carrier interconnection interfaces as well. A desirable interconnection scheme possessing these attributes is best provided through direct mating between carrier contact pads, thus eliminating the need for secondary connector components such as headers and receptacles. Elimination of secondary connector hardware also allows for added flexibility within constrained three dimensional form factor packaging spaces commonly encountered within rigid disk drives, printers, and a variety of consumer electronics hardware. These interconnection designs are commonly referred to as pad on pad connections.

For flex circuit pad on pad contacts, an interconnection scheme is usually provided with raised metal bumps on flex contact pad locations. The raised cable contacts make electrical interconnections with opposing pads on carrier electronics and provide reliability when contacts possess noble or semi-noble surface finishes and are mechanically affixed with secondary hardware that provides necessary normal forces to the mated pad on pad contacts. Raised contact bumps on flex circuits are usually made in one of two ways. The first method typically involves hot deformation of a flex circuit at the base metal copper contact pad locations. After deformation, the raised contacts must be rigidized to prevent base metal copper bump contact relaxation and creep in the presence of constant loads required for interconnection reliability (loads are typically 70–300 gmF per contact). Rigidization of the thin, soft raised copper bumps is accomplished by plating with a thick (10–30 $\mu$m) coating of nickel, followed by a final overplating of tin, palladium, gold, or hardened contact finish such as palladium-nickel, nickel or cobalt doped gold. The second method used for raised bump formation does not require hot deformation to define the raised contact bumps. In this case, bumps are made by selective application of very thick plated coatings of copper and overplate layers at the contact sites, as in the first method. Regardless of the process used, the contacts must be sufficiently resistant to relaxation and wear prompted from multiple plugging, merges, and sustained connector loads. Unfortunately, manufacture of both types of bump contact structures is very expensive, as selective platings and high plating thicknesses require multiple and slow process sequences. Reliability of these structures can also be suspect, since use of thick nickel coatings can result in residual stress buildup in both the plating and base metal and prompt cracking of bumps and adjoining traces in process and/or in field service. In addition, hot deformed and plated bump structures are not sufficiently rigid to survive additional lamination cycles without sustaining flattening damage if required on certain flex carrier designs.

SUMMARY OF THE INVENTION

The pad on pad connector of the present invention uses a rigid stiffener with raised features to provide simultaneous formation and rigidization of interconnection bump features at pad on pad contact locations on a single sided or double sided flex circuit core or multi layer flex circuits. The features or bumps may be created by casting, machining, or molding a rigid stiffener; however, the use of a coining operation provides a low cost method of fabrication that also utilizes the deformation inherent in the process to enhance rigidity and stiffness of the bumps created. The flex circuit core assembly includes copper circuit traces and pads, an electrically insulating cover film, and thin nickel underplating and noble or semi-noble overplating at contact pad surfaces. The raised surface features or bumps on the stiffener are aligned with specific plated contact pad features on the flex core assembly. Subsequent lamination of the stiffener to the flex circuit using an adhesive layer and an elevated temperature, provides the simultaneous stiffener attachment and selective hot deformation of the flex circuit pad on pad contact locations and results in formation of the necessary raised contact features. Because this structure provides a permanent and sculpted rigid backing, pad on pad contacts are not subject to deformation damage if added lamination processing is required on the flex circuit. Further, since the stiffener provides the rigidity to the raised bumps, need for the use of expensive and time consuming thick nickel underplatings is eliminated. Moreover, the presence of a permanent formed stiffener backing also eliminates the potential for connector bump relaxation over time under high contact normal forces. The stiffener material chosen may be application specific and can be made from a variety of low cost rigid materials. These materials include metals such as aluminum or stainless steel; organic materials such as liquid crystal polymers (LCP), polyetherimides, glass reenforced epoxies, nylon or other plastics, or composite materials comprised of many of the aforementioned organic materials reenforced with inorganic particles and/or fibers of carbon, glass, boron and/or a variety of ceramic compounds.

DETAILED DESCRIPTION

Figure 1:
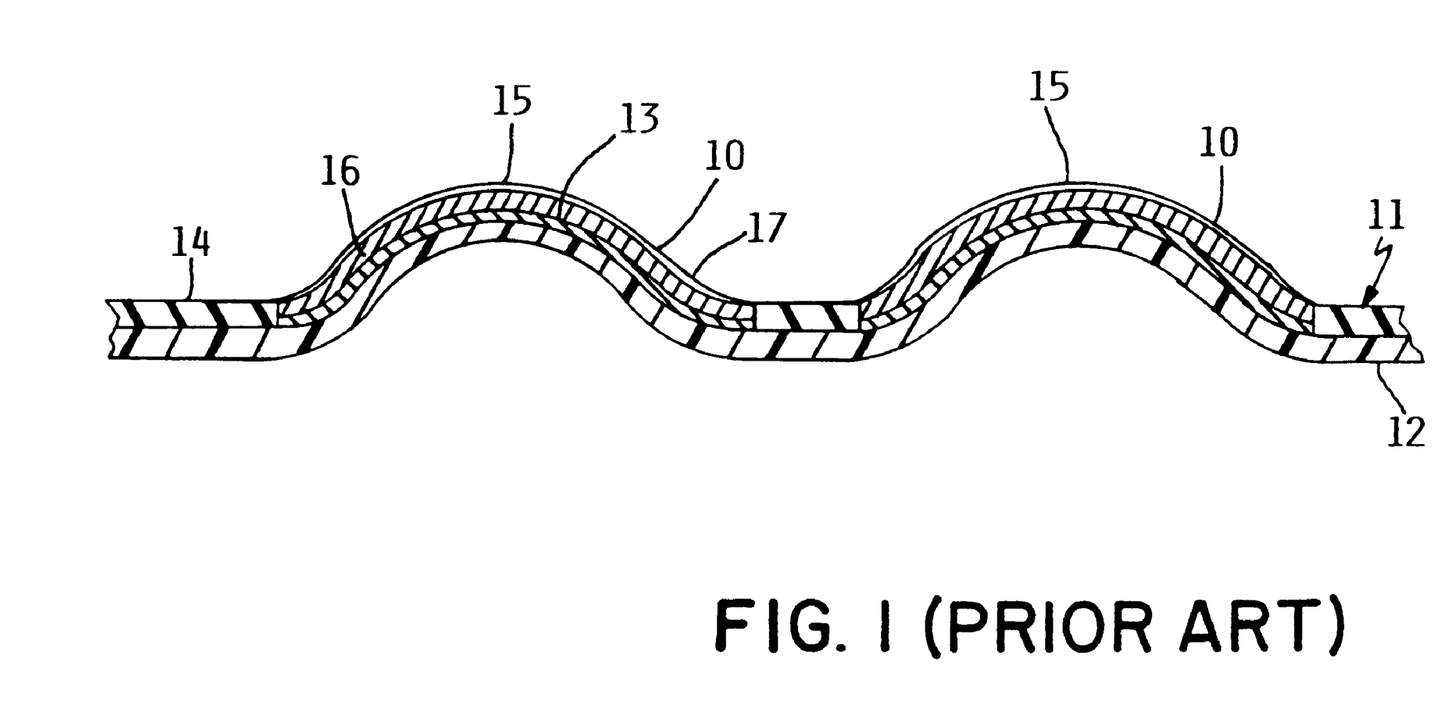
FIG. 1 is a partial section view of a prior art flex cable pad on pad connector location wherein raised contact pad locations have been formed by hot deformation of the flex cable.

FIG. 1 illustrates a prior art method of providing a raised pad connector surface 10 on a flex cable 11 by using hot deformation of the flex cable circuits at the copper contact pad locations. The flexcable 11 includes a flexible core material 12, copper circuit elements 13, and an electrically insulating coverlay 14 which insulates the conductors except for defined terminal portions. Flex cable 11 is initially deformed to displace the cable and copper contact pad at the contact location 10 to form a raised feature or bump 15. After deformation, the bump 15 formed in the flex cable core material 12 and the copper contact pad 13 must be rigidized to resist relaxation and creep and maintain a reliable electrical contact when subjected to constant compressive loads in the normal connection application, typically 70–300 gmf per contact. For this purpose the copper surface of the bump 15 is plated with a thick nickel coating 16 of 10 to 30 μm, followed by a final overplating 17 of a noble or semi-noble metal such as gold, palladium, or tin or an alloy of such metals.

Figure 2:
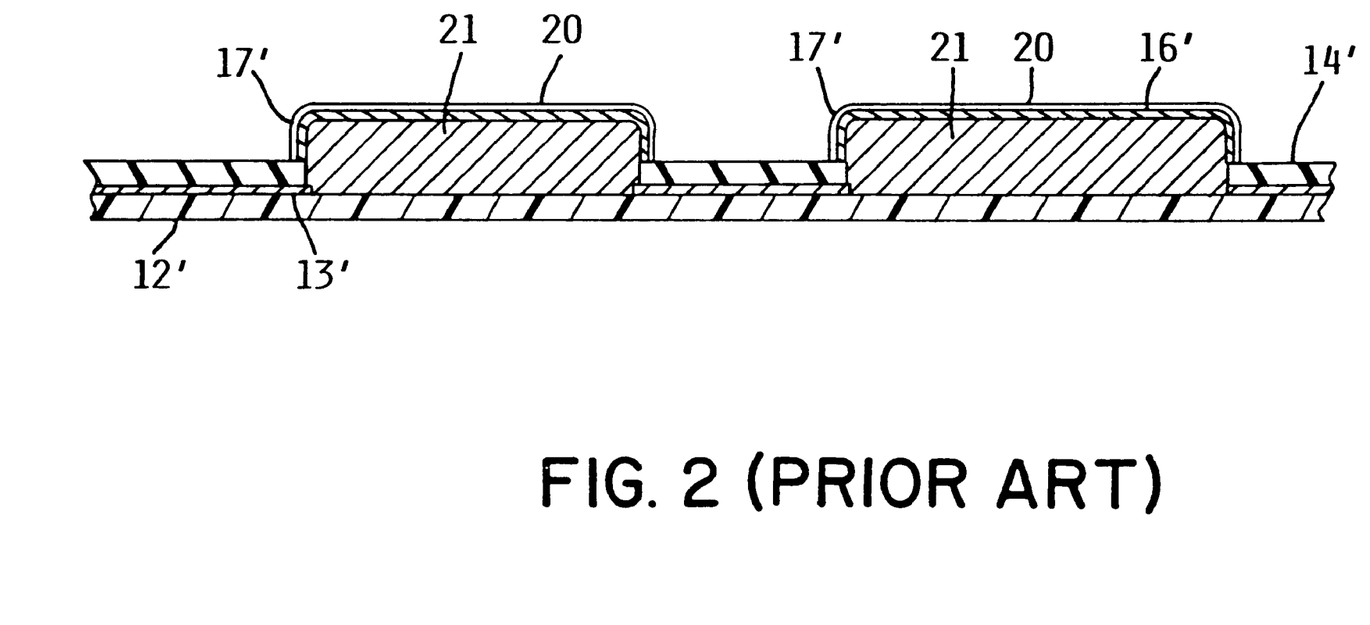
FIG. 2 is a partial section view of a prior art flex cable pad on pad connector location wherein raised contact pad locations have been formed by plating the cable contact pad location to produce the desired height of the contact pad surface.

FIG. 2 illustrates an alternate prior art means for providing a raised contact pad which does not employ hot deformation. The flexible cable core 12' carries copper circuitry 13' and an insulating coverlay 14' that is selectively applied to expose copper circuit portions at terminal surface areas such as the contact pad locations 20. A very thick copper coating 21 is applied by plating the copper terminal surface until the required contact height is achieved. The raised contact pad is then overplated with a nickel layer 16' followed by a noble or semi-noble metal plated layer 17' as applied to the raised terminal pad of FIG. 1. Both of these pad generation techniques require thick platings on pad surfaces and the process expense and process time necessary to achieve the needed thickness. Both these approaches to raised pad generation are also subject to the stress buildup mechanical problems often associated with a prolonged plating sequence.

Figure 3:
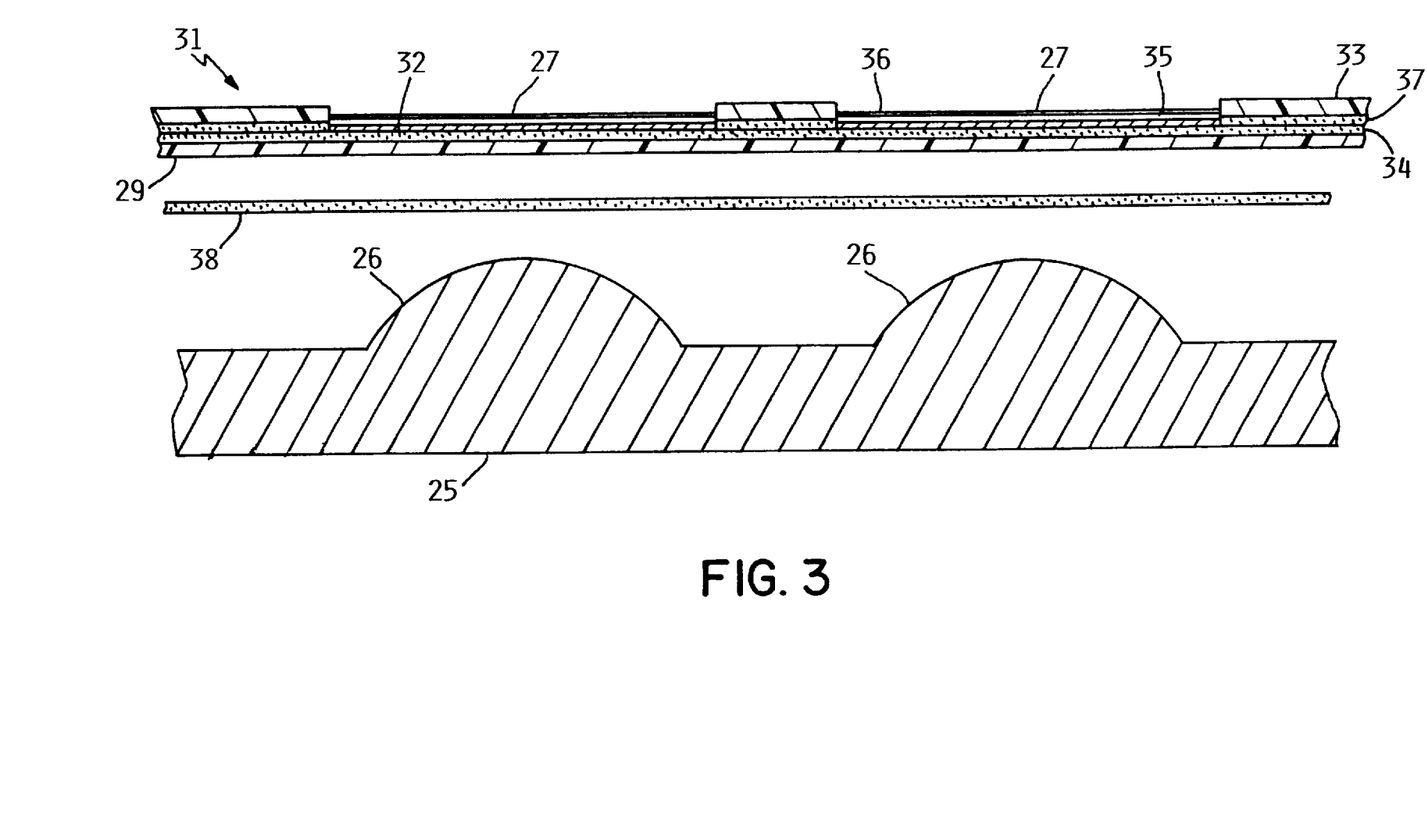
FIG. 3 is an exploded partial section view of the structure of a flex cable terminal portion, adhesive layer and stiffener used in practicing the present invention.
Figure 4:
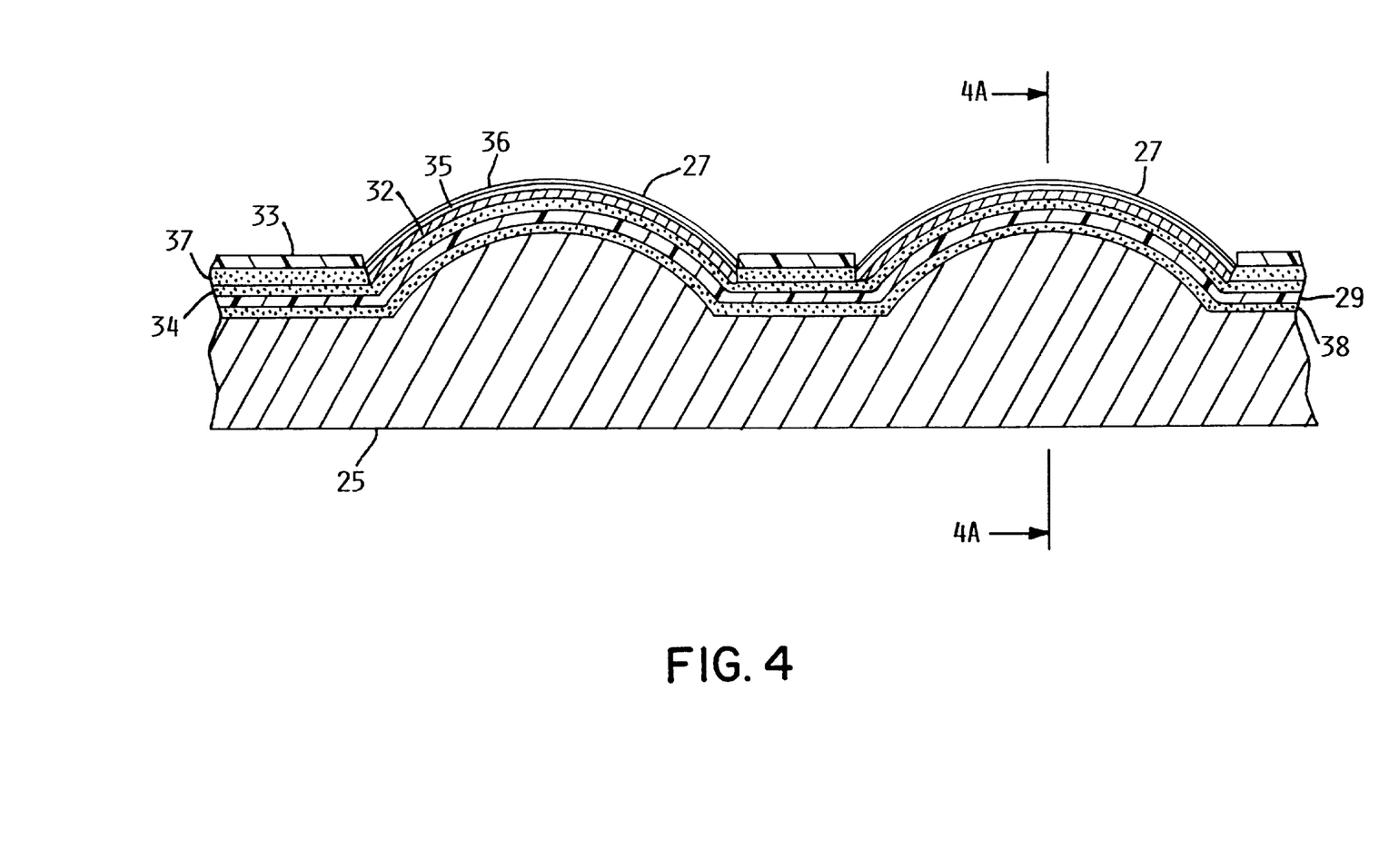
FIG. 4 is an assembled partial section view of the elements illustrated in FIG. 3.

FIGS. 3 and 4 illustrate the raised contact pad formation technique of the present invention. A rigid stiffener 25 is used, which may be formed by any of the common fabrication techniques such as molding, casting, machining or coining to create raised features or bumps 26 that are aligned with pad on pad contact locations 27 on a flex cable circuit core 29. The stiffener 25 may be formed of one of numerous low cost rigid materials including metals, such as aluminum or stainless steel; organic materials, such as liquid crystal polymers, polyetherimides, nylon or other plastics; or composite materials, such as the above organic compounds reenforced with inorganic fibers or particles of glass, carbon, boron, various ceramic compounds or combinations thereof.

The flex cable assembly 31 includes the flex circuit core 29 with copper circuit traces and connector pads 32 which are electrically insulated, except at connector pad and other terminal locations, by an overlying coverlay 33. The flex cable assembly 31 is fabricated by adhering a copper layer 32 to the flex core 29 using a layer of adhesive 34. After curing the adhesive, the copper layer is etched to form the conductor pattern. The coverlay 33 is secured to the balance of the flex cable assembly by a second adhesive layer 37 which overlies the conductors (other than at terminal pad locations) and the exposed portion of the cured adhesive layer 34. As shown in enlarged partial section in FIG. 4A, the surface of copper connector pad 32 has a thin nickel underplating 35 and a thin noble metal or semi-noble metal overplating 36. Since the nickel layer in the present environment does not function either to provide the raised connector pad or to rigidify a deformed pad location, only a thin plated layer 35, with a thickness of 50–200 microinches (1–5 micrometers) is required to act as a diffusion barrier that prevents copper migration into the overplating surface.

Figure 4A:
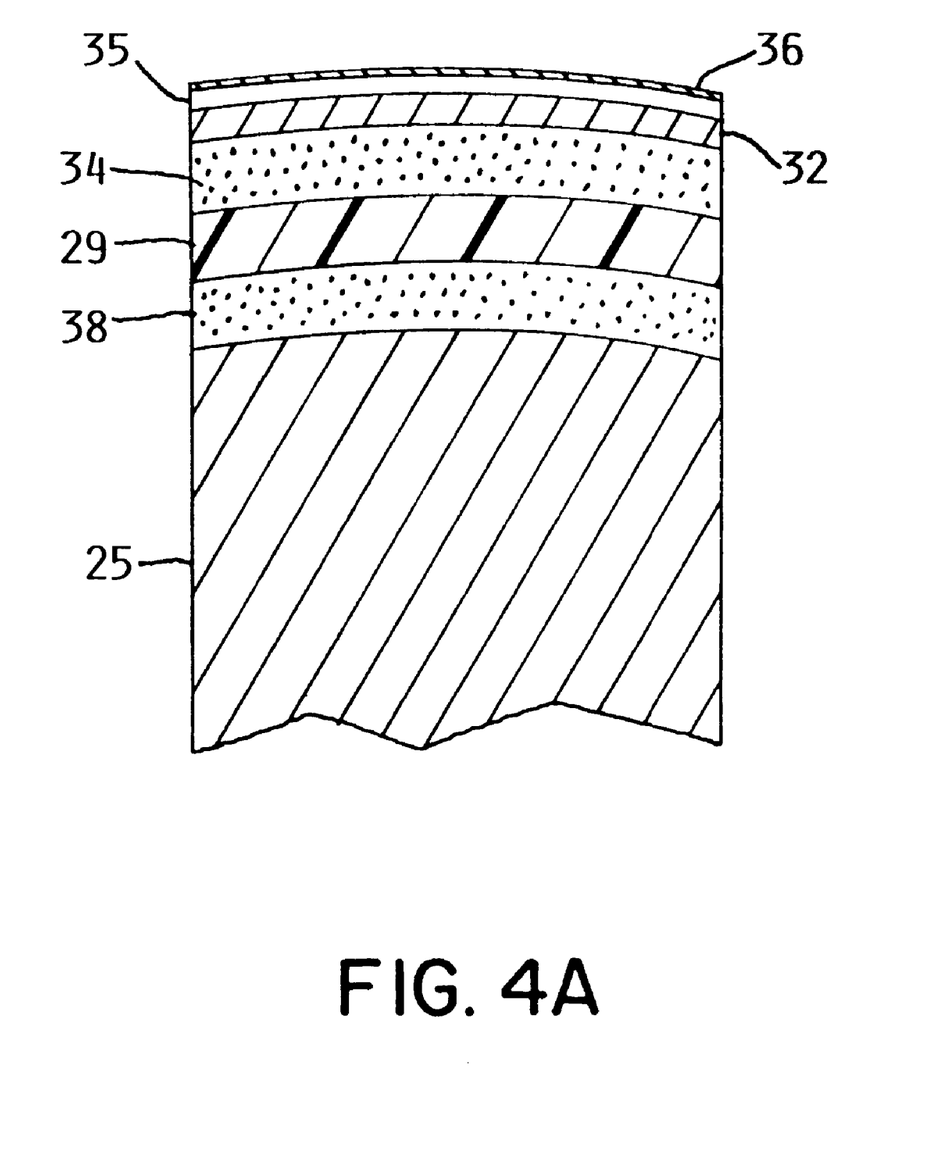
FIG. 4A is an enlarged partial section along line 4A—4A of FIG. 4 showing the material layers at the surface of the bump or raised feature.

Thus, the need for long duration, costly nickel plating sequences is avoided The overplating 36 may be gold, tin, or such harder materials as palladium, palladium/nickel, or gold doped with nickel or cobalt to ensure overplating surface wear and abrasion resistance. For harder materials such as paladium, paladium/nickel, or nickel and cobalt doped golds, the overplating coating has a thickness of 20–40 microinches. For softer materials such as tin or pure gold, a thicker coating ranging from 50–200 microinches is preferred.

The lamination of the flex cable assembly 31 to the stiffener 25 is effected by a film or layer of adhesive 38. Use of a thermally cured adhesive such as epoxy, acrylic, or phenolic butyrol base, which laminates the flex cable to the stiffener at an elevated temperature, enables simultaneous stiffener attachment and hot deformation the flex cable assembly at the pad on pad contact locations 27. The stiffener 25, with the flex cable assembly laminated thereto, as shown in FIG. 4, produces the required raised contact pad features with permanent, sculpted backing that are not subject to deformation damage if added lamination processing of the flex circuit is required. Further, the permanently formed stiffener avoids the possible reduction of the contact pad projection height over time in the presence of high contact normal forces.

A preferred mode of practicing the invention is the use of an aluminum stiffener 25 that has been coined to produce the rounded, raised features 26 that are positioned to be aligned with the pad on pad connector surfaces on a flex cable assembly 31 to which it is to be laminated. The use of a coining operation is an economical process for creating the sculpted stiffener raised contact features 26, which also enhances the rigidity of the stiffener by work hardening the metal as the projections are formed.

The height of the raised feature or bump that is coined or otherwise formed on the stiffener in accordance with the present invention, should as a minimum, cause the contact pad surface to project above the flex cable surface which is the exposed surface of the electrically insulating coverlay. The coverlay and adhesive film in practice usually range from ½ to 2 mils thickness. Thus the bump or stiffener projection must deform the contact surface at least 1 mil during the combined hot deformation, lamination process as the stiffener is attached. The minimum bump height to effect the desired result would be 1½ mils. The height of the laminated contact pad is diminished by the localized thinning of the flex cable during hot deformation and increased by the thickness of the nickel and noble metal plated coatings on the contact pads. A typical single sided flex cable would have a 1 mil core and 1 mil adhesive film underlying an 0.7 mil etched copper layer with defined pads that would deform to provide bump sites during lamination. This results in a single sided flex cable thickness at the pad of 2.7 mils. A double sided cable would include an additional sequence of adhesive, copper, adhesive and coverlay on the opposite side of the core. In addition, the core is often 2 mils thick rather than 1 mil thick in a double sided flex cable. Thus in such a double sided flex cable, the thickness at the pad location is about 7½ mils which would change the response during hot deformation, requiring a somewhat higher stiffener bump or raised feature.

Most peripheral devices that are to be used with computers and other data processing apparatus are subjected to an industry standard form factor that dictates the height, width and depth of the space within which the device must be confined. The form factor dimensions are usually not generous. Further, to maximize the effectiveness of the device, the principal component assembly must be maximized and the remaining space used to accommodate the required circuit elements. In a rigid disk drive, for example, it is desired to use the maximum diameter disks and the full form factor height for the disk stack. Other apparatus, such as an optical transceiver device, will optimize the optical components and seek circuit component packaging technology that enables the required components to occupy the residual volume. These constraints often require that a flexible printed circuit (FPC) be used as the primary carrier for wiring and attachment of passive discrete components and direct chip attachment (DCA) media control logic integrated circuits (ICS). To achieve compactness, the FPC must commonly be laminated to and folded over several metal stiffeners to support mounting of the required devices and subsequent FPC assembly integration to both internal device hardware and the external frame, shield and housing. Electrical analysis indicates that a pad on pad connector layout will best support optimal data transfer at multi gigabyte rates. In order to package the FPC within the residual volume of the form factor, the cable and pad on pad interconnection layout must withstand stiffener lamination and fold lamination steps during cable manufacture without sustaining damage. Because current pad on pad flexible contacts and processes do not support packaging requirements and alternate connector configurations, which use connector component hardware, also cannot support clean electrical signal propagation at multi-gigabyte rates, a new pad on pad contact structure, flex circuit cross section, and cable manufacturing process is needed. The pad on pad structure of the present invention achieves the required connector reliability.

Figure 5:
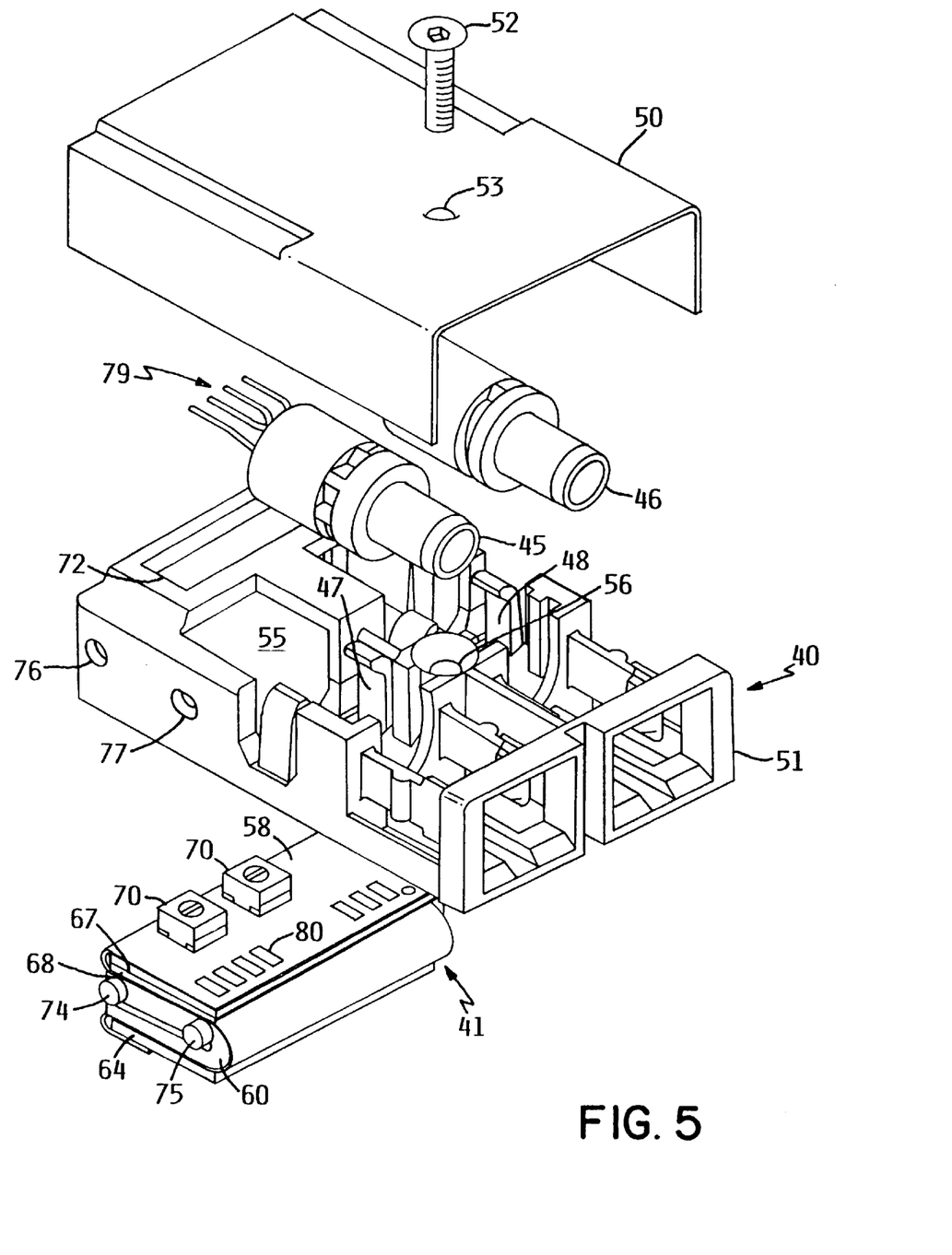
FIG. 5 is an exploded view of a device that incorporates the present invention in the flex cable circuit package portion.

FIG. 5 shows an optical device 40 which utilizes the present invention in the circuit package 41. Illustrated is an optical transceiver device 40 including a transmitter subassembly 45 and a receiver subassembly 46 which are respectively received in housing compartments 47 and 48. Cover 50 is secured to housing 51 by a self threading screw 52 that passes through opening 53 and extends into housing opening 56. The circuit package 41 is supported within the cavity 55 in housing 51. The circuit package 41 is supported within the housing cavity 55 and enables the required circuitry to be contained within a confined volume and also enables a single circuit package to be replaced to support various models of the device.

Figure 6:
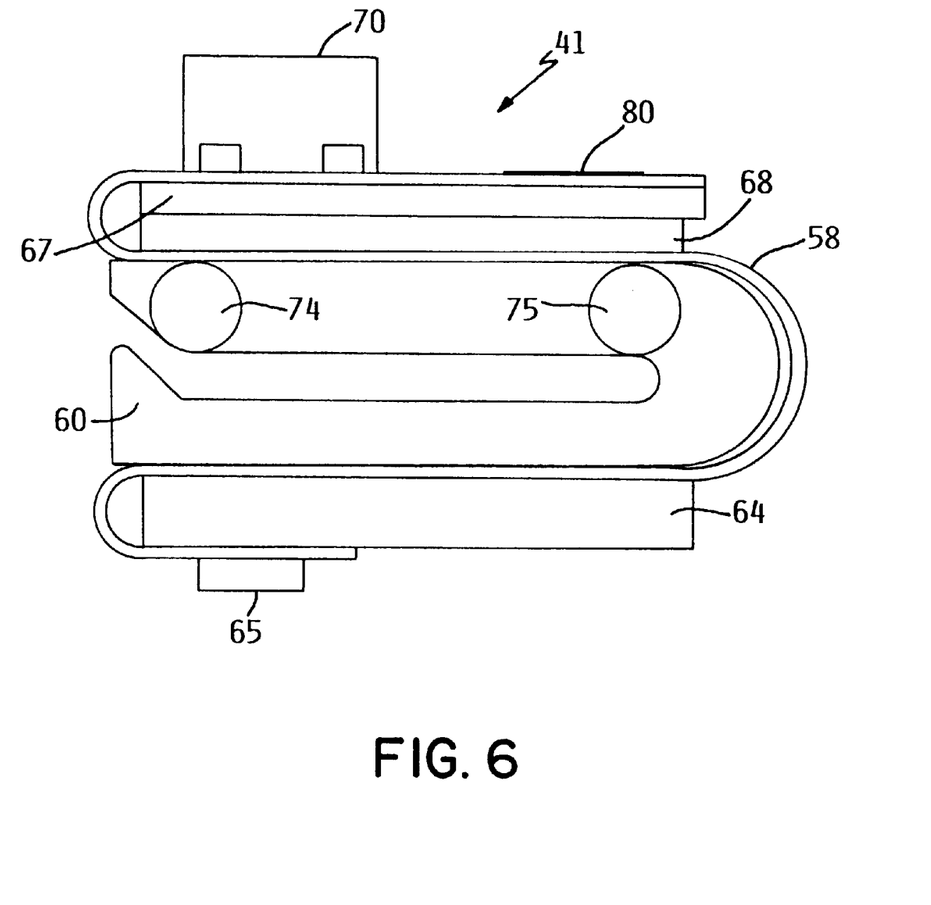
FIG. 6 is a side elevation of the circuit package of FIG. 5.
Figure 7:
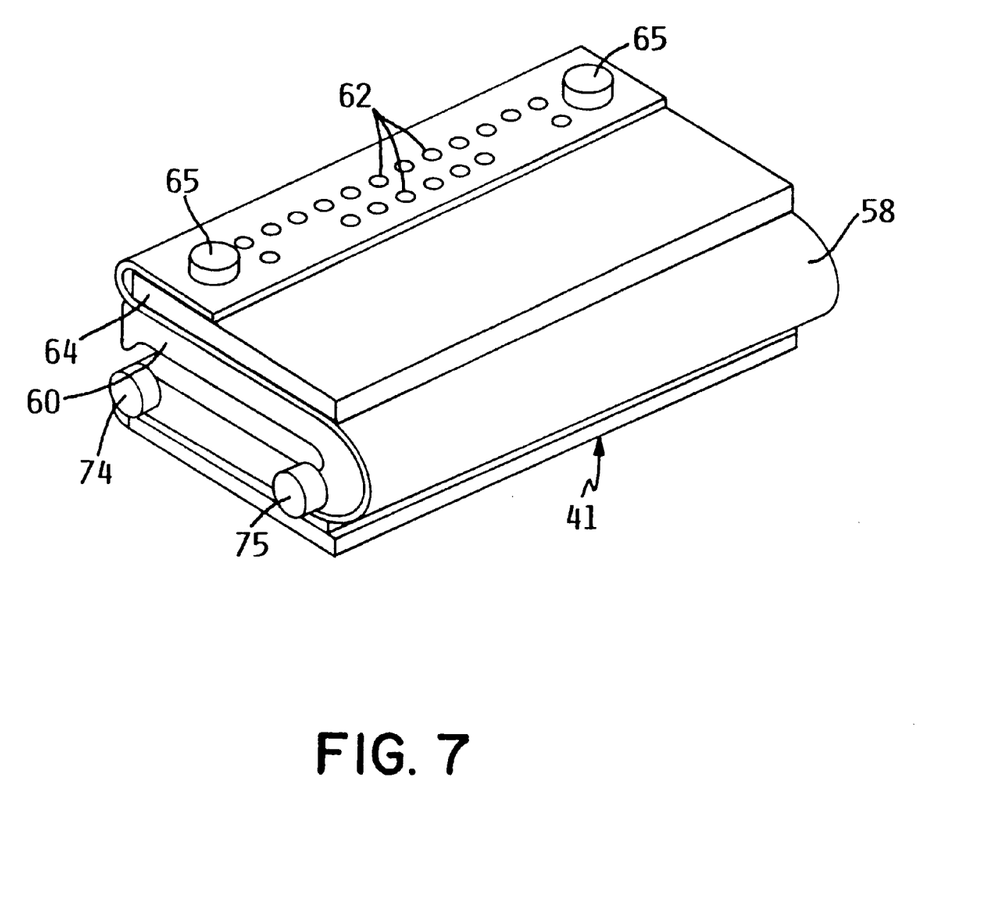
FIG. 7 is a perspective view showing the flex cable circuit package of FIG. 5 inverted to expose the raised pad on pad contacts.

The circuit package 41 of FIG. 5 is also shown in side elevation in FIG. 6 and inverted in FIG. 7. Circuit package 41 includes a serpentine flex circuit 58 mounted on a resilient, U-shaped spring member 60 which can yield and recover to provide a normal force uniformly to the bump connector pads 62 (FIG. 6). The flex cable assembly includes a stiffener 64 which is coined, as taught by the present invention, to provide bumps or raised features aligned with the flex cable pad on pad contacts 62 and is laminated to the flex cable. Alignment pins 65 are formed as an integral portion of spring member 60 and extend through aligned openings in stiffener 64 and flex cable 58 laminated thereto. The circuit package 41 is secured within cavity 55 of housing 40.

Metal stiffeners 67 and 68 are laminated to flex cable 58 and abut one another within the folded cable to support the cable at locations where components, such as potentiometers 70 are mounted and provide a heat sinking function. The potentiometers 70 extend into the housing opening 72 when the circuit package is mounted in the housing cavity 55. Circuit package 41 is supported within housing 40 by alignment pin pairs 74 and 75 which are formed at each side of U-shaped spring member 60 and are received respectively in housing alignment openings 76 and elongated support openings 77. Optical assembly leads 79 are respectively soldered to the cable flat connector pads 80.

The bump connector pads 62 are exposed at the bottom rear surface of the assembled optical device 40 and are biased by the resilient, U-shaped spring member 60 to effect a pressure contact with the cooperating pads on an adjacent surface. The alignment pins 65 are received in corresponding openings in the confronting surface to both align the respective pad on pad contacts and to hold the raised bump pads of the circuit out of contact until alignment is effected.

While the invention has been particularly shown and described with reference to preferred embodiments thereof, it will be understood by those skilled in the art that various changes in form and details may be made therein without departing from the spirit and scope of the invention.

What is claimed is:

1. A flex cable presenting a pad on pad connector assembly comprising:

a terminal portion of said flex cable which includes a series of contact pad locations at one surface of said flex cable;

an adhesive layer adjoining said terminal portion of said flex cable at the surface opposite said one surface; and a rigid stiffener which presents integral rounded embossed projections respectively aligned with said series of contact pad locations and is laminated to said flex cable surface opposite said one surface by said adhesive layer to form raised pad on pad contact locations, whereby such raised contact pad locations provide initial point contact and resist relaxation over time when subjected to high contact normal forces, wherein said rounded embossed projections are each formed as a spherical cap embossment on a metal stiffener surface and form a contact pad surface which makes a high pressure point contact with a cooperating planar pad, wherein said rigid stiffener is formed of a rigid metal selected from the group consisting of aluminum, stainless steel and mixtures thereof and is coined to form said rounded embossed projections.

2. A flex cable assembly for pad on pad electrical connection comprising:

a flex cable having a terminal portion which presents a series of connector pads at one surface of said flex cable;

an adhesive film adhered to said flex cable terminal portion surface opposite said one surface; and a rigid stiffener including a series of integral, rounded projections which is laminated to said terminal portion by said adhesive film, said series of integral projections being respectively aligned with said series of connector pads and displacing said connector pads above the remainder of said one flex cable surface with each connector pad presenting a contact surface that substantially conforms to the configuration of the aligned, underlying stiffener projection, wherein said rigid stiffener is formed of a rigid metal selected from the group consisting of aluminum, stainless steel and mixtures thereof and is coined to form said rounded projections.

3. The flex cable assembly of claim 2 wherein said adhesive film is a thermocuring adhesive, whereby lamination of said cable to said stiffener causes hot deformation of said flex cable at the locations of said connector pads.

4. A flex cable presenting a connector pad assembly for pad on pad electrical connection comprising:

a surface portion of said cable which includes a series of contact pad locations;

an adhesive film adjacent said flex cable at the cable surface opposite said surface portion; and a rigid stiffener member presenting a generally planar surface with rounded projections formed integral therewith and aligned respectively with said contact pad locations, said stiffener being laminated to said flex cable by said adhesive film, whereby said contact pad locations are deformed to conform to the surface of said rounded projections and caused to project above the flex cable surface of said surface portion, wherein said stiffener is formed of metal which has been coined to create said integral, rounded projections.

5. The flex cable of claim 4 wherein said adhesive film is a thermosetting adhesive and said pad contact locations have been hot deformed to conform to said stiffener rounded projections during lamination of flex cable to said stiffener.

6. A method for forming a flex cable assembly for pad on pad electrical connection, said method comprising the steps of:

coining a rigid stiffener formed of metal to produce an integral, rounded projection; and laminating a flex cable over said rigid stiffener so that a connector pad of said flex cable is affixed over said integral, rounded projection, thereby defining a raised contact pad.

7. The method of claim 6, wherein said rigid stiffener is formed of metal selected from a group consisting of aluminum stainless steel and mixtures thereof.

8. The method of claim 6, wherein said laminating step includes the substeps of:

providing a thermosetting adhesive film between said flex cable and said rigid stiffener; and hot deforming said connector pad of said flex cable to conform to said integral, rounded projection of said rigid stiffener.

* * * * *